(12) United States Patent
Yamanaka et al.

(10) Patent No.: US 11,508,797 B2
(45) Date of Patent: Nov. 22, 2022

(54) DISPLAY DEVICE INCLUDING ISLAND-SHAPED INORGANIC FILMS

(71) Applicant: SHARP KABUSHIKI KAISHA, Sakai (JP)

(72) Inventors: Masaki Yamanaka, Sakai (JP); Masahiko Miwa, Sakai (JP); Yohsuke Kanzaki, Sakai (JP); Takao Saitoh, Sakai (JP); Yi Sun, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 162 days.

(21) Appl. No.: 16/969,461

(22) PCT Filed: Feb. 22, 2018

(86) PCT No.: PCT/JP2018/006398
§ 371 (c)(1),
(2) Date: Nov. 13, 2020

(87) PCT Pub. No.: WO2019/163045
PCT Pub. Date: Aug. 29, 2019

(65) Prior Publication Data
US 2021/0098553 A1  Apr. 1, 2021

(51) Int. Cl.
*H01L 27/32* (2006.01)
*H01L 51/00* (2006.01)
(Continued)

(52) U.S. Cl.
CPC ...... *H01L 27/3276* (2013.01); *H01L 51/0097* (2013.01); *H01L 51/5253* (2013.01);
(Continued)

(58) Field of Classification Search
CPC ............ H01L 27/3276; H01L 27/3258; H01L 27/3211; H01L 27/3218; H01L 27/3265;
(Continued)

(56) References Cited

U.S. PATENT DOCUMENTS

| 2008/0024402 A1* | 1/2008 | Nishikawa | ............. H05B 33/22 345/82 |
| 2014/0232956 A1* | 8/2014 | Kwon | ............... G02F 1/133305 349/12 |

(Continued)

FOREIGN PATENT DOCUMENTS

JP 2014-232300 A 12/2014

*Primary Examiner* — Ida M Soward
(74) *Attorney, Agent, or Firm* — ScienBiziP, P.C.

(57) ABSTRACT

A display device includes: a resin substrate; a TFT layer; a bending portion; at least one inorganic film forming the TFT layer; an interlayer insulating film forming the TFT layer; and a plurality of wires forming the TFT layer, wherein the at least one inorganic film and the interlayer insulating film include an opening disposed at the bending portion, the at least one inorganic film includes a plurality of island-shaped inorganic films remaining in the opening, each of the plurality of wires overlaps a corresponding island-shaped inorganic film among the plurality of island-shaped inorganic films, and the display device includes a metal layer in a form of islands disposed between each of the plurality of wires and the corresponding island-shaped inorganic film overlapping each of the plurality of wires, the metal layer being in contact with each of the plurality of wires.

14 Claims, 8 Drawing Sheets

(51) Int. Cl.
*H01L 51/50* (2006.01)
*H01L 51/52* (2006.01)
*G02F 1/133* (2006.01)
*G09F 9/30* (2006.01)
*G02F 1/1333* (2006.01)

(52) U.S. Cl.
CPC ........ *G02F 1/133305* (2013.01); *G09F 9/301* (2013.01); *H01L 27/3211* (2013.01); *H01L 27/3218* (2013.01); *H01L 27/3265* (2013.01); *H01L 51/502* (2013.01); *H01L 51/5048* (2013.01); *H01L 51/5056* (2013.01); *H01L 51/5072* (2013.01); *H01L 51/5088* (2013.01); *H01L 51/5092* (2013.01); *H01L 51/5209* (2013.01); *H01L 2251/301* (2013.01)

(58) Field of Classification Search
CPC ............. H01L 51/0097; H01L 51/5253; H01L 51/5088; H01L 51/5092; H01L 51/5048; H01L 51/5209; H01L 51/502; H01L 51/5072; H01L 51/5056; H01L 2251/301; H01L 2251/5338; G02F 1/133305; G09F 9/301

See application file for complete search history.

(56) References Cited

U.S. PATENT DOCUMENTS

| | | | |
|---|---|---|---|
| 2014/0353670 A1 | 12/2014 | Youn et al. | |
| 2015/0287750 A1 | 10/2015 | Youn et al. | |
| 2016/0035759 A1* | 2/2016 | Kwon | H01L 27/1225 438/151 |
| 2016/0035812 A1* | 2/2016 | Kwon | H01L 27/1218 438/151 |
| 2018/0033821 A1* | 2/2018 | Kim | H01L 27/124 |
| 2018/0040633 A1* | 2/2018 | Lee | H01L 27/1262 |
| 2018/0053905 A1* | 2/2018 | Lee | H01L 27/3262 |
| 2018/0166019 A1* | 6/2018 | Lee | H01L 51/5203 |
| 2019/0363152 A1* | 11/2019 | Kanzaki | H05B 33/22 |
| 2019/0386081 A1* | 12/2019 | Okabe | H01L 27/3237 |
| 2021/0005841 A1* | 1/2021 | Ohta | H05B 33/02 |

* cited by examiner

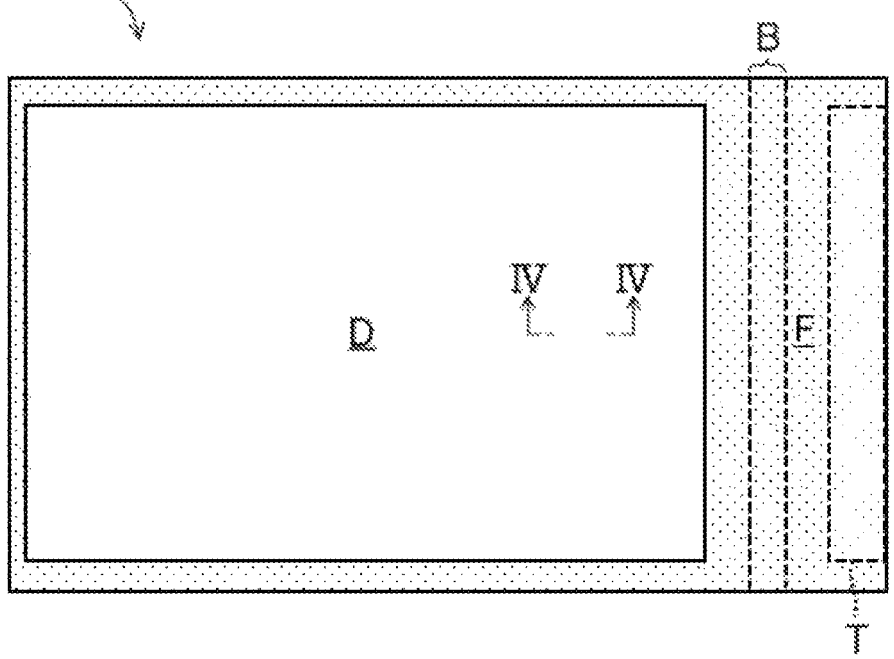
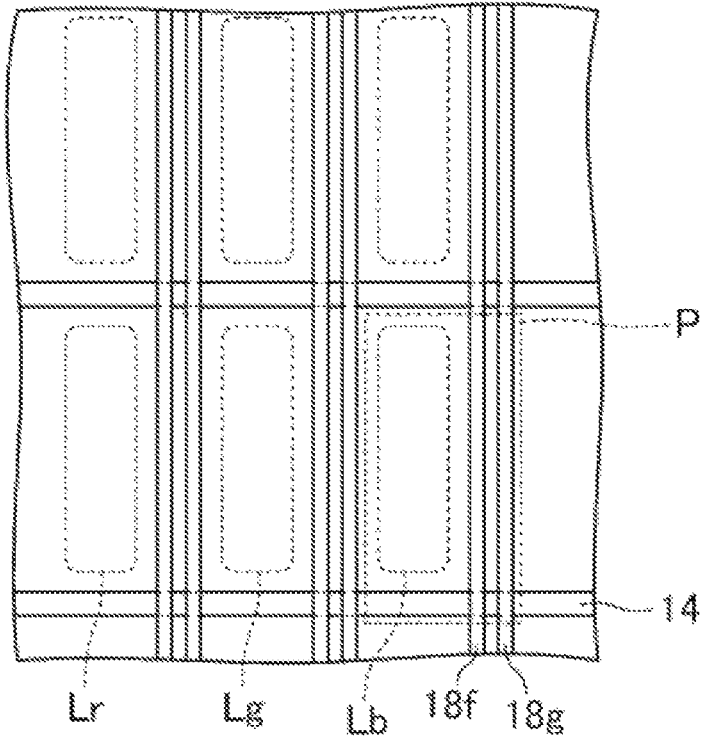

DISPLAY DEVICE INCLUDING ISLAND-SHAPED INORGANIC FILMS

TECHNICAL FIELD

The disclosure relates to a display device.

BACKGROUND ART

Attention has been recently drawn to self-emission organic EL display devices each using organic electroluminescence (EL) elements, as a display device instead of liquid-crystal displays. One of such organic EL display devices that has been proposed is a flexible organic EL display device in which the organic EL elements and other components are mounted on a flexible resin substrate. The organic EL display device herein has a rectangular display region for image display. Around the display region is a frame region, and this frame region needs to be scaled down. In the flexible organic EL display device, bending the frame region near a terminal to scale down the frame region, for instance, can break wires disposed in the frame region.

For instance, Patent Literature 1 discloses a flexible display device that has a bending hole, so that each of a buffer film, gate insulating film and interlayer insulating film corresponding to a bending region is partly removed to avoid a wire break.

CITATION LIST

Patent Literature

Patent Literature 1: Japanese Patent Application Laid-Open No. 2014-232300

SUMMARY

Technical Problem

The flexible organic EL display device includes, on the resin substrate, inorganic insulating films, such as a base coat film, gate insulating film and interlayer insulating film. For the purpose of preventing a wire break in the frame region, the inorganic insulating films at a bending portion in the frame region can be removed to prevent the inorganic insulating films from a break at the bending portion. The wires in the frame region are, although disposed in a location where the inorganic insulating films at the bending portion have been removed, can be broken by excessive stress that is applied when the frame region is bent. The wires hence require improvements.

To solve the above problem, it is an object of the disclosure to prevent a wire break at the bending portion in the frame region.

Solution to Problem

To solve the above problem, the disclosure provides a display device that includes a resin substrate, a TFT layer disposed on the resin substrate, a light-emitting element disposed on the TFT layer and forming a display region, a frame region disposed around the display region, a terminal region disposed at the end of the frame region, a bending portion extending in one direction between the display region and the terminal region, at least one inorganic film forming the TFT layer and adjacent to the resin substrate, and an interlayer insulating film forming the TFT layer and more remote from the resin substrate than the at least one inorganic film is. The interlayer insulating film is made of an inorganic material. The display device also includes a plurality of wires forming the TFT layer. The wires are disposed on the interlayer insulating film in the frame region and extending in parallel with each other in a direction intersecting a direction where the bending portion extends. The at least one inorganic film and the interlayer insulating film have an opening disposed at the bending portion. The opening penetrates the at least one inorganic film and the interlayer insulating film in the thickness direction. The at least one inorganic film includes a plurality of island-shaped inorganic films remaining in the opening. Each of the wires overlaps a corresponding island-shaped inorganic film among the island-shaped inorganic films. The display device also includes a metal layer in the form of islands disposed between each of the wires and the island-shaped inorganic films overlapping each of the wires. The metal layer is in contact with each of the wires.

Advantageous Effect of Disclosure

In the disclosure, the island-shaped metal layer is disposed between each wire and the island-shaped inorganic film overlapping the wire and is in contact with the wire. This configuration can prevent a wire break at the bending portion in the frame region.

BRIEF DESCRIPTION OF DRAWINGS

FIG. 1 is a schematic plan view of the configuration of an organic EL display device according to a first embodiment of the disclosure.

FIG. 2 is a detailed plan view of the configuration of a display region of the organic EL display device according to the first embodiment of the disclosure.

DESCRIPTION OF EMBODIMENTS

Embodiments of the disclosure will be detailed with reference to the drawings. The disclosure is not limited to the following embodiments.

First Embodiment

Figure 3:
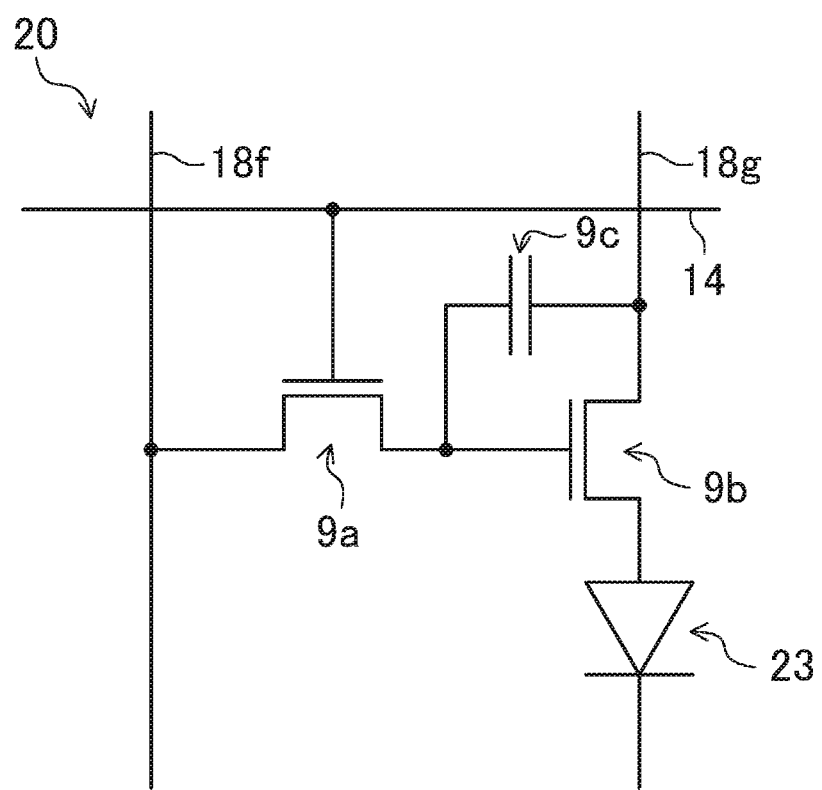
FIG. 3 is an equivalent circuit diagram of a TFT layer forming the organic EL display device according to the first embodiment of the disclosure.
Figure 4:
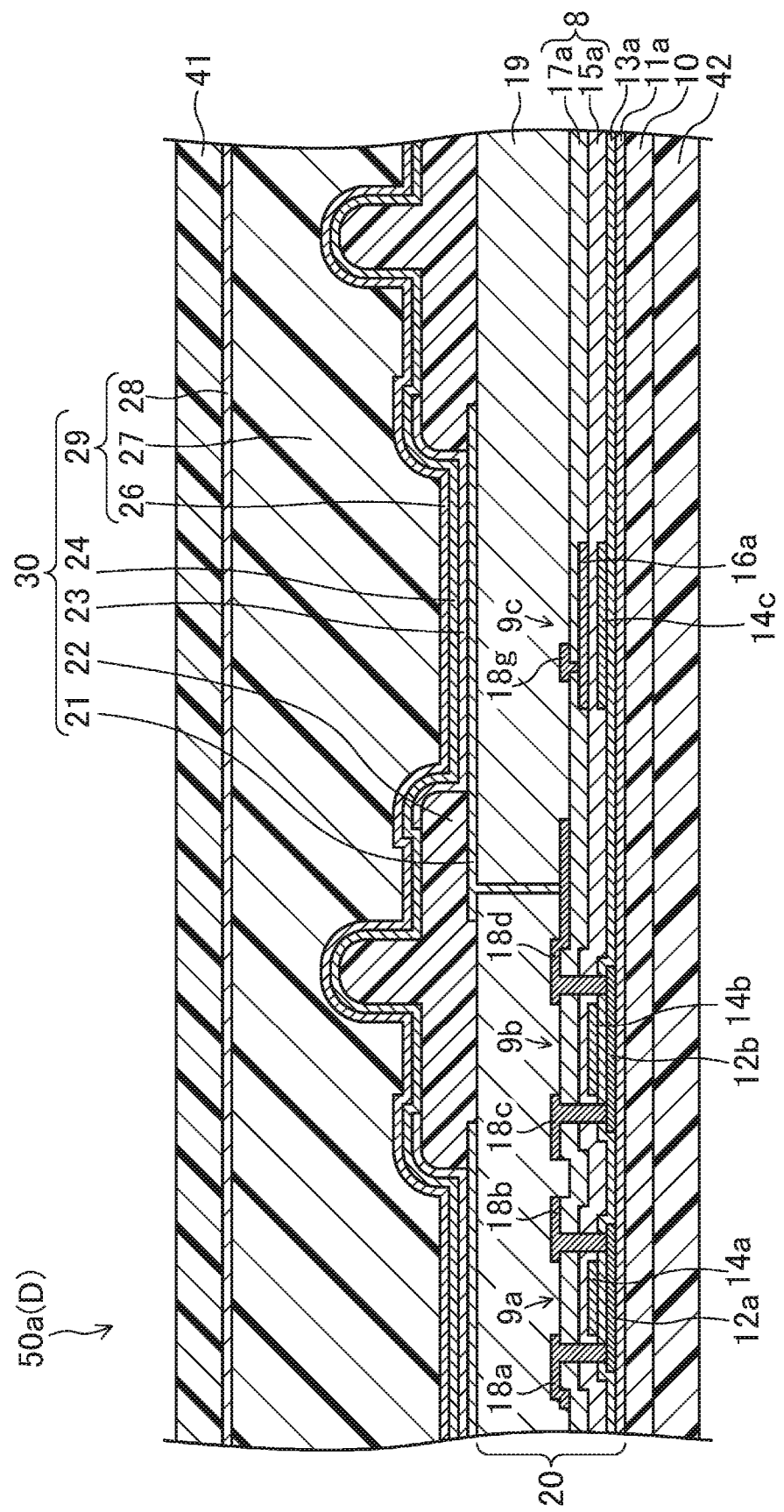
FIG. 4 is a detailed cross-sectional view of the configuration of the display region of the organic EL display device, taken along line IV-IV in FIG. 1.
Figure 5:
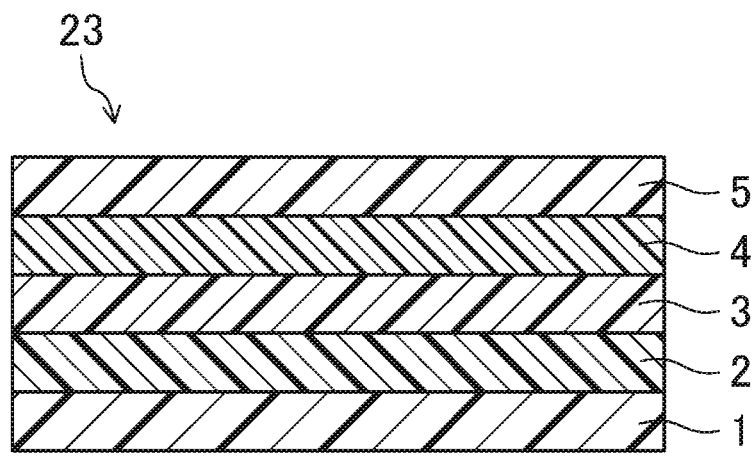
FIG. 5 is a cross-sectional view of an organic EL layer forming the organic EL display device according to the first embodiment of the disclosure.
Figure 6:
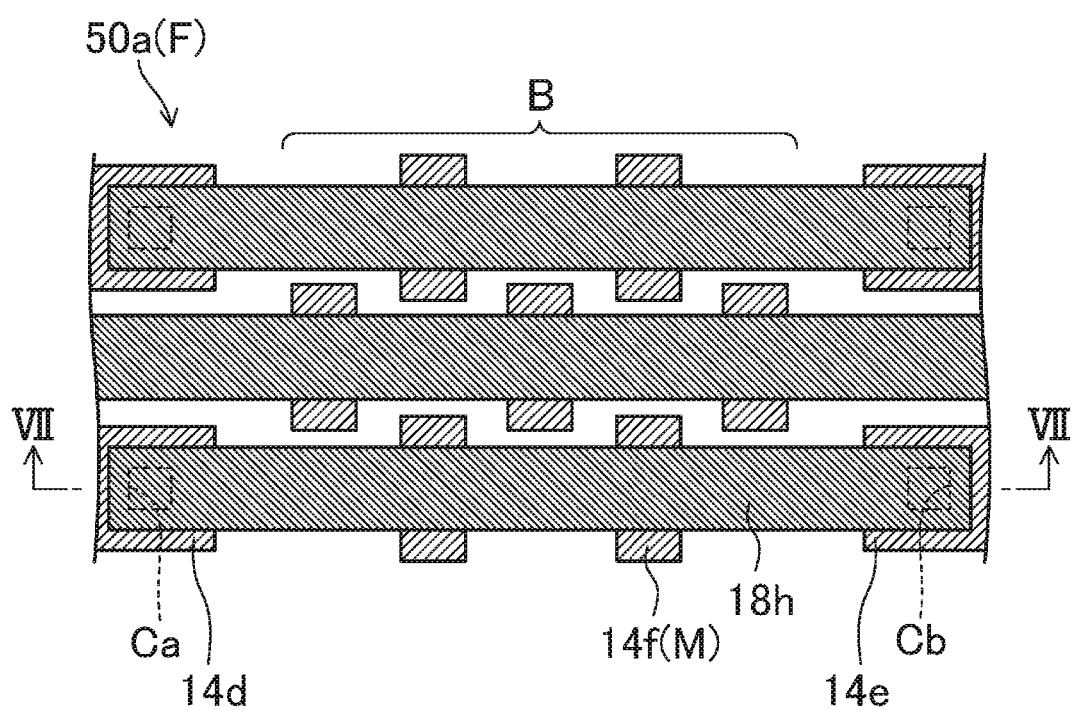
FIG. 6 is a plan view of a frame region of the organic EL display device according to the first embodiment of the disclosure.
Figure 7:
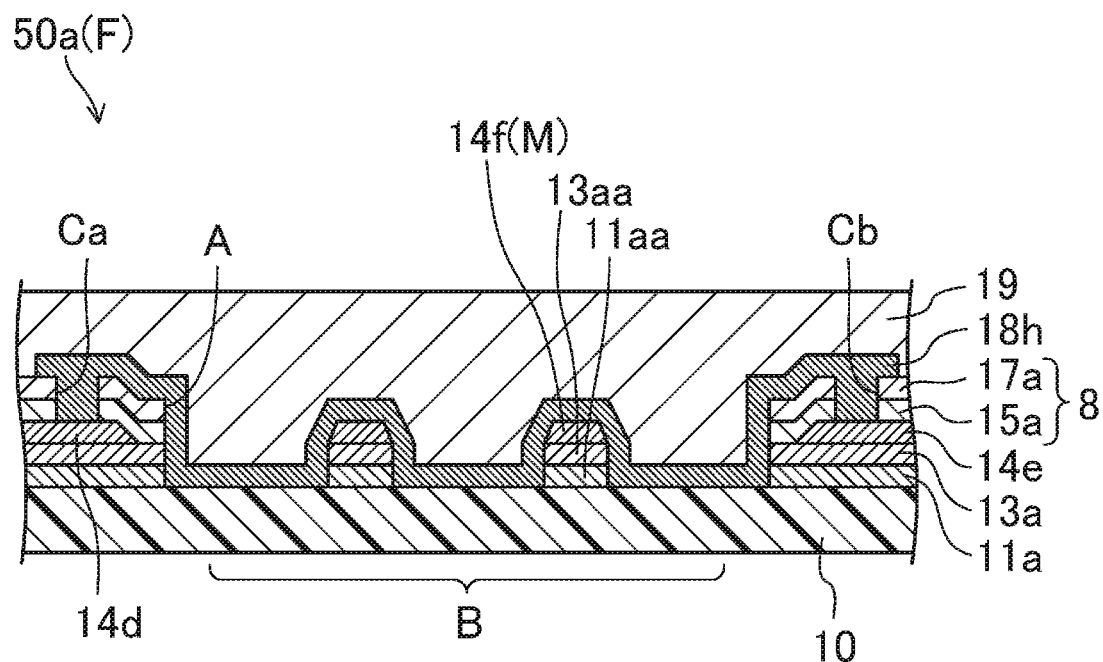
FIG. 7 is a cross-sectional view of the frame region of the organic EL display device, taken along line VII-VII in FIG. 6.

FIGS. 1 to 10 each illustrate a first embodiment of a display device according to the disclosure. Each embodiment describes, by way of example only, an organic EL display device that includes organic EL elements, as a display device that includes light-emitting elements. FIG. 1 is a schematic plan view of the configuration of an organic EL display device 50a according to this embodiment. FIG. 2 is a detailed plan view of the configuration of a display region D of the organic EL display device 50a. FIG. 3 is an equivalent circuit diagram of a TFT layer 20 forming the organic EL display device 50a. FIG. 4 is a detailed cross-sectional view of the configuration of the display region D of the organic EL display device 50a, taken along line IV-IV in FIG. 1. FIG. 5 is a cross-sectional view of an organic EL layer 23 forming the organic EL display device 50a. FIG. 6 is a plan view of a frame region F of the organic EL display device 50a. FIG. 7 is a cross-sectional view of the frame region F of the organic EL display device 50a, taken along line VII-VII in FIG. 6. In the plan view of FIG. 6, a flattening film 19 and an interlayer insulating film 8 (described later on) are omitted, and an arrangement of frame wires 18h and gate conductive layers 14d to 14f (descried later on) is illustrated.

As illustrated in FIG. 1, the organic EL display device 50a has the rectangular display region D for image display, and the frame region F having a frame shape and disposed around the display region D.

Arranged in the display region D are multiple pixels in matrix. In each pixel, a sub-pixel P having a red-light-emitting region Lr for displaying red gradation, a sub-pixel P having a green-light-emitting region Lg for displaying green gradation, and a sub-pixel P having a blue-light-emitting region Lb for displaying blue gradation are arranged to be adjacent to each other as illustrated in FIG. 2 for instance.

The frame region F has an end (i.e., the right end in FIG. 1) at which a terminal region T is disposed. The frame region F also has, between the display region D and the terminal region T, a bending portion B extending in one direction along one of the sides of the display region D (i.e., the right side in the drawing), as illustrated in FIG. 1. At the bending portion B, the frame region F is bent at 180 degrees (i.e., a U-shape) about an axis in the vertical direction of the drawing.

As illustrated in FIG. 4, the organic EL display device 50a includes, in the display region D, a resin substrate layer 10, the TFT layer 20 disposed on the upper surface of the resin substrate layer 10, organic EL elements 30 disposed on the TFT layer 20, a front protective layer 41 disposed on the organic EL elements 30, and a back protective layer 42 disposed on the lower surface of the resin substrate layer 10.

The resin substrate layer 10 serves as a resin substrate and is made of, for instance, polyimide resin.

The TFT layer 20 includes the following components as illustrated in FIG. 4: a base coat film 11a disposed on the resin substrate layer 10; multiple first thin-film transistors (TFTs) 9a, multiple second TFTs 9b and multiple capacitors 9c all of which are disposed on the base coat film 11a; and a flattening film 19 disposed on the first TFTs 9a, second TFTs 9b and capacitors 9c. As illustrated in FIGS. 2 and 3, disposed in the TFT layer 20 are multiple gate lines 14 extending in parallel with each other in the horizontal direction of the drawings. As illustrated in FIGS. 2 and 3, also disposed in the TFT layer 20 are multiple source lines 18f extending in parallel with each other in the vertical direction of the drawings. As illustrated in FIGS. 2 and 3, also disposed in the TFT layer 20 are multiple power-source lines 18g that extend in parallel with each other in the vertical direction of the drawings and are adjacent to the respective source lines 18f In the TFT layer 20, each sub-pixel P has the corresponding first TFT 9a, second TFT 9b and capacitor 9c as illustrated in FIG. 3.

The base coat film 11a is composed of an inorganic insulating monolayer film of, for instance, silicon nitride, silicon oxide or silicon oxide nitride, or is composed of an inorganic insulating laminated film of these materials.

The first TFT 9a is connected to the corresponding gate line 14 and source line 18f in each sub-pixel P, as illustrated in FIG. 3. As illustrated in FIG. 4, each first TFT 9a includes a semiconductor layer 12a in the form of islands disposed on the base coat film 11a, a gate insulating film 13a (i.e., an inorganic film) disposed over the semiconductor layer 12a, a gate electrode 14a disposed on the gate insulating film 13a and overlapping part of the semiconductor layer 12a, an interlayer insulating film 8 disposed over the gate electrode 14a, and a source electrode 18a and drain electrode 18b spaced away from each other on the interlayer insulating film 8. The interlayer insulating film 8 herein includes a first interlayer insulating film 15a adjacent to the gate electrode 14a, and a second interlayer insulating film 17a stacked on the first interlayer insulating film 15a and adjacent to the source electrode 18a and drain electrode 18b. The gate insulating film 13a, first interlayer insulating film 15a, and second interlayer insulating film 17a are each composed of an inorganic insulating monolayer film of, for instance, silicon nitride, silicon oxide or silicon oxide nitride, or is composed of an inorganic insulating laminated film of these materials.

The second TFT 9b in each sub-pixel P is connected to the corresponding first TFT 9a and power-source line 18g, as illustrated in FIG. 3. The second TFT 9b includes, as illustrated in FIG. 4, a semiconductor layer 12b in the form of islands disposed on the base coat film 11a, a gate insulating film 13a (i.e., an inorganic film) disposed over the semiconductor layer 12b, a gate electrode 14b disposed on the gate insulating film 13a and overlapping part of the semiconductor layer 12b, the interlayer insulating film 8 disposed over the gate electrode 14b, and a source electrode 18c and drain electrode 18d spaced away from each other on the interlayer insulating film 8. Although the first TFTs 9a and the second TFTs 9b are each a top-gate TFT in this embodiment by way of example only, these TFTs each may be a bottom-gate TFT.

The capacitor 9c in each sub-pixel P is connected to the corresponding first TFT 9a and power-source line 18g, as illustrated in FIG. 3. The capacitor 9c includes, as illustrated in FIG. 4, a lower conductive layer 14c disposed in the same layer as the gate electrodes and made of the same material as the gate electrodes, includes the first interlayer insulating film 15a disposed over the lower conductive layer 14c, and includes an upper conductive layer 16a (i.e., a capacitance line) disposed on the first interlayer insulating film 15a and overlapping the lower conductive layer 14c. As illustrated in FIG. 4, the upper conductive layer 16a is between the first interlayer insulating film 15a and the second interlayer insulating film 17a, and is connected to the power-source line 18g through a contact hole disposed in the second interlayer insulating film 17.

The flattening film 19 is made of colorless transparent organic resin material, such as polyimide resin.

The organic EL elements 30 are light-emitting elements constituting the display region D. The organic EL elements 30 include, as illustrated in FIG. 4, multiple first electrodes 21, an edge cover 22, multiple organic EL layers 23, a second electrode 24, and a seal film 29.

The first electrodes 21 are arranged in matrix on the flattening film 19 so as to correspond to the sub-pixels P, as illustrated in FIG. 4. As illustrated in FIG. 4, each first electrode 21 is connected to the drain electrode 18d of the corresponding second TFT 9b through a contact hole disposed in the flattening film 19. The first electrodes 21 have the function of injecting holes into the organic EL layers 23. The first electrodes 21 are preferably made of material having a large work function, in order to improve the efficiency of hole injection into the organic EL layers 23. The first electrode 21 is made of metal material, including silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). The first electrodes 21 may be made of an alloy of, for instance, astatine (At) and astatine oxide (AtO$_2$). Furthermore, the first electrodes 21 may be made of conductive oxide, such as tin oxide (SnO), zinc oxide (ZnO), indium tin oxide (ITO), or indium zinc oxide (IZO). The first electrodes 21 each may be composed of a stack of multiple layers made of the above materials. Here, examples of a compound material having a large work function include indium tin oxide (ITO) and indium zinc oxide (IZO).

The edge cover 22 is disposed in lattice and covers the perimeter of each first electrode 21, as illustrated in FIG. 4. The edge cover 22 is an organic film made of, for instance, polyimide resin, acrylic resin, polysiloxane resin, or novolak resin.

The organic EL layers 23 are disposed on the respective first electrodes 21 and are arranged in matrix so as to correspond to the sub-pixels, as illustrated in FIG. 4. As illustrated in FIG. 5, each organic EL layer 23 includes, sequentially on the first electrode 21, a hole injection layer 1, a hole transport layer 2, a light-emitting layer 3, an electron transport layer 4, and an electron injection layer 5.

The hole injection layer 1 is also called an anode buffer layer and has the function of bringing the energy levels of the first electrode 21 and organic EL layer 23 close to each other to improve the efficiency of hole injection from the first electrode 21 to the organic EL layer 23. Examples of the material of the hole injection layer 1 include a triazole derivative, oxadiazole derivative, imidazole derivative, polyarylalkane derivative, pyrazoline derivative, phenylenediamine derivative, oxazole derivative, styrylanthracene derivative, fluorenone derivative, hydrazone derivative, and stilbene derivative.

The hole transport layer 2 has the function of improving the efficiency of hole transport from the first electrode 21 to the organic EL layer 23. Examples of the material of the hole transport layer 2 include a porphyrin derivative, aromatic tertiary amine compound, styrylamine derivative, polyvinylcarbazole, poly-p-phenylenevinylene, polysilane, triazole derivative, oxadiazole derivative, imidazole derivative, polyarylalkane derivative, pyrazoline derivative, pyrazolone derivative, phenylenediamine derivative, arylamine derivative, amine-substituted chalcone derivative, oxazole derivative, styrylanthracene derivative, fluorenone derivative, hydrazone derivative, stilbene derivative, hydrogenated amorphous silicon, hydrogenated amorphous silicon carbide, zinc sulfide, and zinc selenide.

The light-emitting layer 3 is a region where holes and electrons are injected from the first electrode 21 and second electrode 24 upon voltage application via the first electrode 21 and second electrode 24, and is a region where the holes and electrons rejoin. The light-emitting layer 3 is made of material having high efficiency of light emission. Examples of the material of the light-emitting layer 3 include a metal oxinoid compound [8-hydroxyquinoline metal complex], naphthalene derivative, anthracene derivative, diphenylethylene derivative, vinyl acetone derivative, triphenylamine derivative, butadiene derivative, coumarin derivative, benzoxazole derivative, oxadiazole derivative, oxazole derivative, benzimidazole derivative, thiadiazole derivative, benzthiazole derivative, styryl derivative, styrylamine derivative, bisstyrylbenzene derivative, trisstyrilbenzene derivative, perylene derivative, perynone derivative, aminopyrene derivative, pyridine derivative, rhodamine derivative, acridine derivative, phenoxazone, quinacridone derivative, rubrene, poly-p-phenylenevinylene, and polysilane.

The electron transport layer 4 has the function of moving the electrons to the light-emitting layer 3 efficiently. The electron transport layer 4 is composed of an organic compound, including an oxadiazole derivative, triazole derivative, benzoquinone derivative, naphthoquinone derivative, anthraquinone derivative, tetracyanoanthraquinodimethane derivative, diphenoquinone derivative, fluorenone derivative, silole derivative, and metal oxinoid compound.

The electron injection layer 5 has the function of bringing the energy levels of the second electrode 24 and organic EL layer 23 close to each other to improve the efficiency of electron injection from the second electrode 24 to the organic EL layer 23. This function can lower voltage for driving the organic EL elements 30. The electron injection layer 5 is also called a cathode buffer layer. Examples of the material of the electron injection layer 5 include an inorganic alkali compound, such as lithium fluoride (LiF), magnesium fluoride (MgF$_2$), calcium fluoride (CaF$_2$), strontium fluoride (SrF$_2$), and barium fluoride (BaF$_2$), and include aluminum oxide (Al$_2$O$_3$) and strontium oxide (SrO).

The second electrode 24 is disposed over the organic EL layers 23 and edge cover 22, as illustrated in FIG. 4. The second electrode 24 has the function of injecting the holes into the organic EL layers 23. The second electrode 24 is preferably made of material having a small work function, in order to improve the efficiency of hole injection into the organic EL layers 23. The second electrode 24 is a vapor-deposited film formed through vacuum deposition. Examples of the material of the second electrode 24 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (Lif). The second electrode 24 may be made of, for instance, an alloy of magnesium (Mg) and copper (Cu), an alloy of magnesium (Mg) and silver (Ag), an alloy of sodium (Na) and potassium (K), an alloy of astatine (At) and astatine oxide (AtO$_2$), an alloy of lithium (Li) and aluminum (Al), an alloy of lithium (Li), calcium (Ca) and aluminum (Al), or an alloy of lithium fluoride (LiF), calcium (Ca) and aluminum (Al). The second electrode 24 may be alternatively made of conductive oxide, such as tin oxide (SnO), zinc oxide (ZnO), indium tin oxide (ITO), or indium zinc oxide (IZO). The second electrode 24 may be composed of multiple stacked layers made of the above materials. Examples of the material having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 4, the seal film 29 is disposed over the second electrode 24 and includes, sequentially on the second electrode 24, a first inorganic seal film 26, an organic seal film 27, and a second inorganic seal film 28. The seal film 29 has the function of protecting the organic EL layer 23 from moisture and oxygen.

The first inorganic seal film 26 and the second inorganic seal film 28 are each composed of an inorganic insulating film, such as a silicon nitride film, silicon oxide film, or silicon oxide nitride film.

The organic seal film 27 is made of organic resin material, such as acrylate, epoxy, silicone, polyuria, parylene, polyimide, or polyamide.

The front protective layer and 41 and the back protective layer 42 are made of polyimide resin that is about 2 µm thick, for instance.

As illustrated in FIGS. 6 and 7, the organic EL display device 50a includes the following components in the frame region F: the resin substrate layer 10; the base coat film 11a, gate insulating film 13a and interlayer insulating film 8 sequentially disposed on the upper surface of the resin substrate layer 10; the multiple frame wires 18h disposed on the interlayer insulating film 8 and extending in parallel with each other in a direction orthogonal to a direction where the bending portion B extends; and the flattening film 19 disposed over the frame wires 18h. The front protective layer 41 and the back protective layer 42, which are disposed in the display region D, are disposed in most part of the frame region F as well except the bending portion B.

As illustrated in FIG. 7, the base coat film 11a, gate insulating film 13a and interlayer insulating film 8 have, at the bending portion B in the frame region F, an opening A penetrating the base coat film 11a, gate insulating film 13a, and interlayer insulating film 8 in the thickness direction to expose the upper surface of the resin substrate layer 10. The opening A herein is a groove penetrating in the direction where the bending portion B extends, as illustrated in FIG. 7.

The base coat film 11a and the gate insulating film 13a remain in the form of islands in the opening A, and constitute multiple base coat layers 11aa and multiple gate insulating layers 13aa. In plan view, the base coat layers 11aa and the gate insulating layers 13aa each have a size of about 10 µm×10 µm and have a density of about 1250 islands/mm², for instance.

As illustrated in FIG. 7, each frame wire 18h overlaps, in the opening A, the corresponding base coat layers 11aa and corresponding gate insulating layers 13aa among the multiple base coat layers 11aa and multiple gate insulating layers 13aa. As illustrated in FIGS. 6 and 7, disposed between the frame wire 18h and the gate insulating layers 13aa overlapping the frame wire 18h is the third gate conductive layer 14f (i.e., a metal layer M) in the form of islands that are in contact with the frame wire 18h. As illustrated in FIG. 7, both ends of the frame wire 18h are connected to the respective first gate conductive layer 14d and second gate conductive layer 14e via a respective first contact hole Ca and second contact hole Cb disposed in the interlayer insulating film 8. As illustrated in FIG. 7, the frame wire 18h is in contact with the upper surface of the resin substrate layer 10, in at least part of the opening A of the base coat film 11a, gate insulating film 13a and interlayer insulating film 8. The frame wire 18h is disposed in the same layer as the source electrode 18a and other components, and is made of the same material as the source electrode 18a and other components.

The first gate conductive layer 14d is disposed between the gate insulating film 13a and the first interlayer insulating film 15a, as illustrated in FIG. 7. The gate conductive layer 14d is electrically connected to signal wires (e.g., the gate lines 14, source lines 18f, and power-source lines 18g) disposed in the TFT layer 20 in the display region D. The first gate conductive layer 14d, the second gate conductive layer 14e, and the third gate conductive layer 14f are disposed in the same layer as the gate electrode 14a and other components, and are made of the same material as the gate electrode 14a and other components.

The second gate conductive layer 14e is disposed between the gate insulating film 13a and the first interlayer insulating film 15a, as illustrated in FIG. 7. The second gate conductive layer 14e extends to the terminal region T.

As illustrated in FIG. 7, the third gate conductive layer 14f is provided in such a manner that its perimeter surface at the lower part of the drawing coincides with the perimeter surface of the gate insulating layer 13aa. Here, the coincidence between these perimeter surfaces means that the perimeter surfaces coincide with each other in order to simultaneously undergo etching with the same photo mask and then undergo patterning. This coincidence includes a gap between the perimeter surfaces resulting from a slight difference in etching rate in the vertical direction. Reference is made to a pair of the frame wires 18h adjacent to each other. As illustrated in FIG. 6, the third gate conductive layer 14f along one of the frame wires 18h and the third gate conductive layer 14f along the other frame wire 18h are arranged in a staggered manner so as to overlap each other at their ends in a direction where the frame wires 18h extend (i.e., the lateral direction in the drawing), and so as not to overlap each other in a direction orthogonal to the direction where the frame wires 18h extend (i.e., the vertical direction in the drawing).

Figure 8:
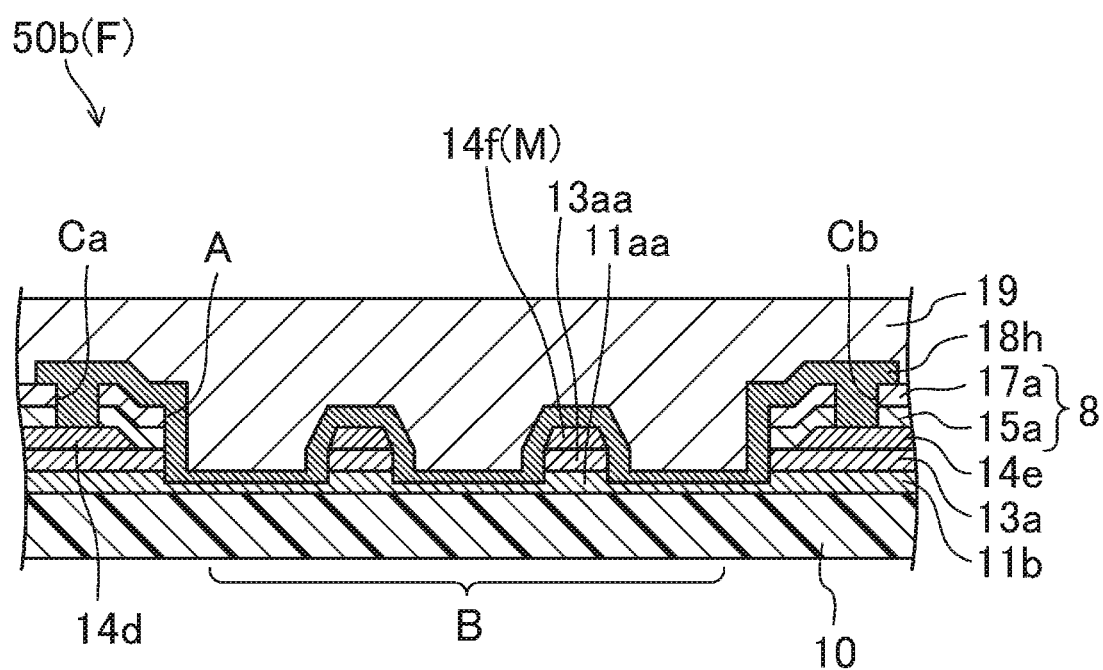
FIG. 8 is a cross-sectional view of the frame region in a first modification of the organic EL display device according to the first embodiment of the disclosure.

This embodiment has described, by way of example only, the organic EL display device 50a that has the opening A penetrating the base coat film 11a, gate insulating film 13a and interlayer insulating film 8. Another embodiment may provide an organic EL display device 50b that has the opening A penetrating the gate insulating film 13a and interlayer insulating film 8, as illustrated in FIG. 8. FIG. 8 is a cross-sectional view of the frame region F of the organic EL display device 50b, which is a first modification of the organic EL display device 50a. FIG. 8 corresponds to FIG. 7.

To be specific, the organic EL display device 50b has no through-holes in the base coat film 11b, and has a recess disposed in the upper surface of the base coat film 11b and overlapping the opening A of the gate insulating film 13a and interlayer insulating film 8, as illustrated in FIG. 8. Here, the frame wire 18h in FIG. 8 is in contact with the upper surface of the base coat film 11b (or the bottom and side surfaces of the recess of this upper surface), in at least part of the opening A of the gate insulating film 13a and interlayer insulating film 8.

Figure 9:
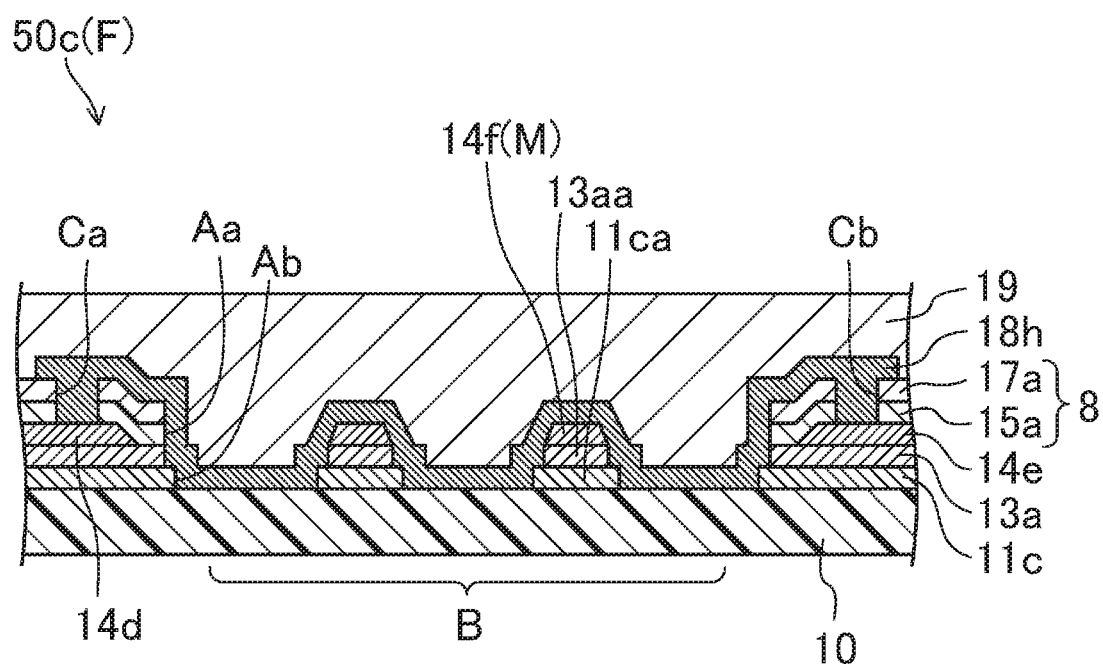
FIG. 9 is a cross-sectional view of the frame region in a second modification of the organic EL display device according to the first embodiment of the disclosure.

The present embodiment has described, by way of example only, the organic EL display device 50a, whose opening A disposed in the base coat film 11a, gate insulating film 13a and interlayer insulating film 8 has a flush end surface. In some embodiments, an organic EL display device 50c may be used whose openings Aa and Ab disposed in the gate insulating film 13a, the interlayer insulating film 8 and a base coat film 11c have end surfaces forming a step. FIG. 9 is a cross-sectional view of the frame region F of the organic EL display device 50c, which is a second modification of the organic EL display device 50a. FIG. 9 corresponds to FIG. 7.

To be specific, the organic EL display device 50c is configured such that the end surface of the opening Ab, disposed in the base coat film 11b, protrudes inward from the opening Aa, disposed in the gate insulating film 13 and interlayer insulating film 8, to form a step. As illustrated in FIG. 9, the frame wire 18h is in contact with the upper surface of the resin substrate layer 10, in at least part of the opening Ab of the base coat film 11b.

This embodiment has described, by way of example only, a stack of the base coat film 11a and gate insulating film 13a as an inorganic film having the opening A. In some embodiments, the inorganic film having the opening A may be composed of at least one of the base coat film 11a, a semiconductor film (i.e., the semiconductor layers 12a and 12b) and the gate insulating film 13a.

In each sub-pixel P, inputting a gate signal to the first TFT 9a through the gate line 14 to turn on the first TFT 9a, followed by applying a predetermined voltage corresponding to a source signal to the gate electrode of the second TFT 9b and to the capacitor 9c through the source line 18f, to supply a current defined based on a gate voltage across the second TFT 9b and coming from the power-source line 18g causes the light-emitting layer 3 of the organic EL layer 23 to emit light. This enables the organic EL display device 50a to display an image. In the organic EL display device 50a, the gate voltage across the second TFT 9b is maintained by the capacitor 9c even when the first TFT 9a is turned off; thus, the light-emitting layer 3 keeps light emission until a gate signal in the next frame is input.

Figure 10:
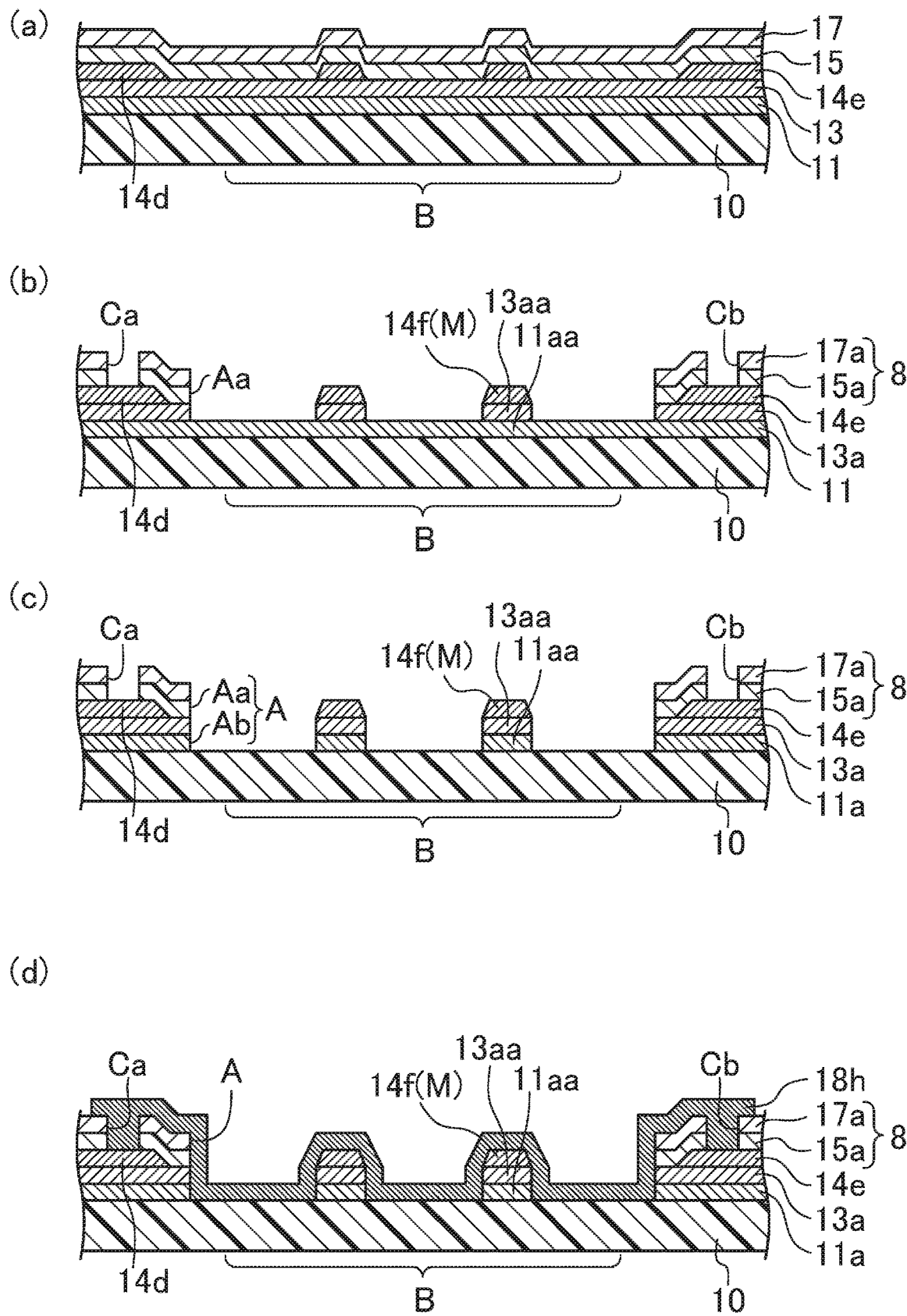
FIG. 10 illustrates, in cross-section, process steps for manufacturing the organic EL display device according to the first embodiment of the disclosure.

A method for manufacturing the organic EL display device 50a according to this embodiment will be described with reference to FIG. 10. FIG. 10 illustrates, in cross-section, process steps for manufacturing the organic EL display device 50a. FIG. 10(a) is a cross-sectional view of the organic EL display device 50a before first etching, FIG. 10(b) is a cross-sectional view of the same after first etching, FIG. 10(c) is a cross-sectional view of the same after second etching, and FIG. 10(d) is a cross-sectional view of the same after wire formation. The method for manufacturing the organic EL display device 50a according to this embodiment includes the following process steps: TFT-layer formation including the first etching, second etching and wire formation; organic-EL-element formation; and processing for flexibility.

Forming of TFT Layer

The TFT layer 20 is formed by forming, through a well-known method, the base coat film 11a, first TFT 9a, second TFT 9b, capacitor 9c and flattening film 19 onto the front surface of the resin substrate layer 10 disposed on a glass substrate, for instance.

The following details how the base coat film 11a, the opening A of the gate insulating film 13a and interlayer insulating film 8, and the frame wire 18h are formed at the bending portion B in the frame region F when the first TFT 9a, second TFT 9b and capacitor 9c are formed in the display region D.

As illustrated in FIG. 10(a), the substrate before the source line 18f and other components are formed has a stack of, in this order, a first inorganic insulating film 11 (that is to be the base coat film 11a), second inorganic insulating film 13 (that is to be the gate insulating film 13a), third inorganic insulating film 15 (that is to be the first interlayer insulating film 15a), and fourth inorganic insulating film 17 (that is to be the second interlayer insulating film 17a).

As illustrated in FIG. 10(c), showing the second etching step, the opening Ab is then formed in the first inorganic insulating film 11 exposed from the stack of the gate insulating film 13a, first interlayer insulating film 15a and second interlayer insulating film 17a, through dry etching.

Furthermore, a metal conductive film is formed onto all over the substrate that has now the opening Ab in the first inorganic insulating film 11, through sputtering. The metal conductive film then undergoes photolithography, etching and resist peeling to form the frame wire 18h as illustrated in FIG. 10(d), showing the wire formation step. The source electrodes 18a and 18c, the drain electrodes 18b and 18d, the source line 18f, and the power-source line 18g are also formed simultaneously in the step of forming the frame wire 18h.

Forming of Organic EL Element

First, the first electrode 21, the edge cover 22, the organic EL layer 23 (i.e., the hole injection layer 1, the hole transport layer 2, the light-emitting layer 3, the electron transport layer 4, and the electron injection layer 5), and the second electrode 24 are formed onto the TFT layer 20, which is formed in the step of forming the TFT layer, through a well-known method.

Then, the organic EL element 30 is formed through the following process steps: forming the first inorganic seal film 26 composed of an inorganic insulating film (e.g., a silicon nitride film) formed through, for instance, plasma chemical vapor deposition (CVD) so as to cover the second electrode 24, followed by forming the organic seal film 27 onto the first inorganic seal film 26 through ink jetting, followed by forming the seal film 29 by forming, onto the organic seal film 27, the second inorganic seal film 28 composed of an inorganic insulating film (e.g., a silicon nitride film) formed through plasma CVD.

Processing for Flexibility

The front protective layer 41 is attached onto the front surface of the seal film 29 of the organic EL element 30, formed in the step of forming the organic EL element, followed by laser light irradiation from a surface of the resin substrate layer 10 adjacent to the glass substrate to peel the glass substrate off from the lower surface of the resin substrate layer 10, followed by attaching the back protective layer 42 onto the lower surface of the resin substrate layer 10 with the glass substrate peeled off therefrom.

The organic EL display device 50a according to this embodiment can be manufactured through these process steps.

As described above, the organic EL display device 50a according to this embodiment is configured such that the base coat film 11a, gate insulating film 13a and interlayer insulating film 8 have, at the bending portion B in the frame region F, the opening A penetrating the base coat film 11a, gate insulating film 13a, and interlayer insulating film 8 in the thickness direction. Herein, the base coat film 11a and the gate insulating film 13a remain in the form of multiple islands in the opening A, and constitute the base coat layers 11aa and the gate insulating layers 13aa. Moreover, each frame wire 18h on the interlayer insulating film 8 overlaps the corresponding island-shaped base coat layers 11aa and corresponding island-shaped gate insulating layers 13 as in the opening A. In addition, the third gate conductive layer 14f is disposed in the form of islands between each frame wire 18h and the gate insulating layers 13aa overlapping each frame wire 18h. The third gate conductive layer 14f is in contact with each frame wire 18h. Consequently, even if the frame wire 18h breaks at a site overlapping the third gate conductive layer 14f, the third gate conductive layer 14f overlapping this site can establish continuity in the frame wire 18h and improve the redundancy of the frame wire 18h, thereby preventing the frame wire 18h from a break at the bending portion B in the frame region F.

The organic EL display device 50a according to this embodiment is configured such that in a pair of the frame wires 18h adjacent to each other, the third gate conductive layer 14f along one of the frame wires 18 and the third gate conductive layer 14f along the other frame wire 18h overlap in a direction where the frame wires 18h extend, and do not overlap in a direction orthogonal to the direction where the frame wires 18h extend. When the third gate conductive layers 14f are disposed in each frame wire 18h, this configuration can bring the adjacent frame wires 18h close to each other, thereby reducing the distance between the adjacent frame wires 18h.

Second Embodiment

Figure 11:
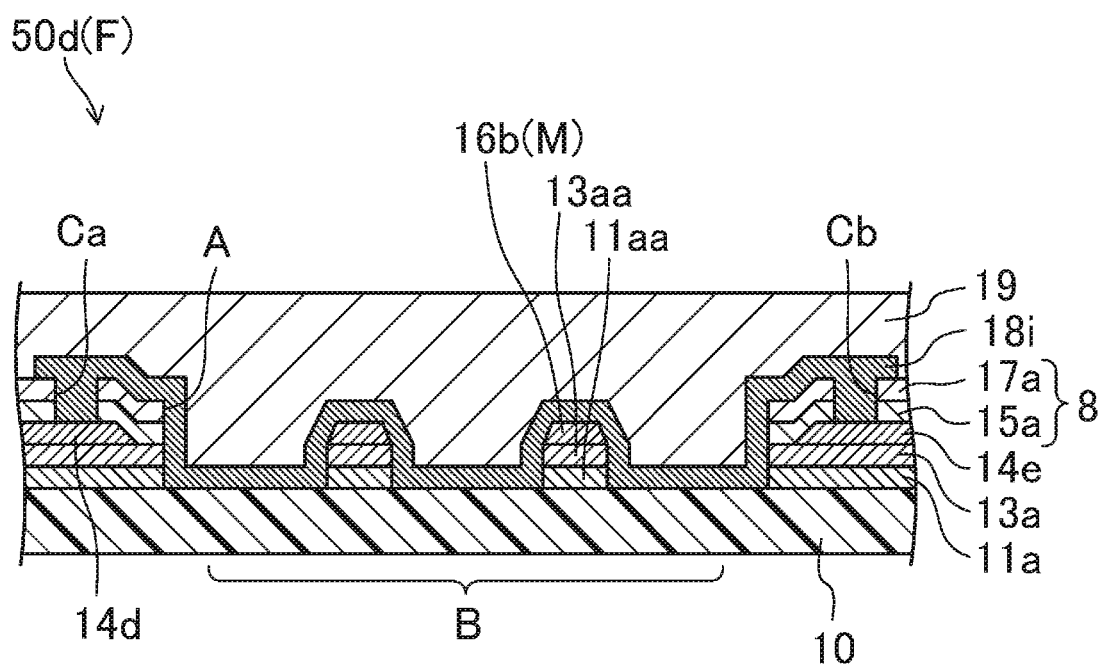
FIG. 11 is a cross-sectional view of the frame region of an organic EL display device according to a second embodiment of the disclosure.

FIG. 11 illustrates a second embodiment of the display device according to the disclosure. FIG. 11 is a cross-sectional view of the frame region F of an organic EL display device 50d according to this embodiment. FIG. 11 corresponds to FIG. 7. In the subsequent embodiments, components that are the same as those shown in FIGS. 1 to 10 will be denoted by the same signs and will not be elaborated upon.

The first embodiment has described, by way of example only, that the organic EL display devices 50a to 50c each include the third gate conductive layers 14f (i.e., metal layers M) that are in contact with the frame wires 18h. The second embodiment describes, by way of example only, that the organic EL display device 50d includes capacitive conductive layers 16b (i.e., metal layers M) that are in contact with frame wires 18i.

The organic EL display device 50d has the rectangular display region D and the frame region F having a frame shape and disposed around the display region D, like the organic EL display device 50a according to the first embodiment.

Like the organic EL display device 50a according to the first embodiment, the organic EL display device 50d includes, in the display region D, the resin substrate layer 10, the TFT layer 20 disposed on the upper surface of the resin substrate layer 10, the organic EL elements 30 disposed on the TFT layer 20, the front protective layer 41 disposed on the organic EL elements 30, and the back protective layer 42 disposed on the lower surface of the resin substrate layer 10.

The organic EL display device 50d also includes the following components in the frame region F: the resin substrate layer 10; the base coat film 11a, gate insulating film 13a and interlayer insulating film 8 sequentially disposed on the upper surface of the resin substrate layer 10; the multiple frame wires 18i disposed on the interlayer insulating film 8 and extending in parallel with each other in a direction orthogonal to a direction where the bending portion B extends; and the flattening film 19 disposed over the frame wires 18i.

As illustrated in FIG. 11, each frame wire 18i overlaps, in the opening A, the corresponding base coat layers 11aa and corresponding gate insulating layers 13aa among the multiple base coat layers 11aa and multiple gate insulating layers 13aa. Disposed between the frame wire 18i and the gate insulating layers 13aa, overlapping the frame wire 18i, is the capacitive conductive layer 16b (i.e., a metal layer M) in the form of islands that are in contact with the frame wire 18i, as illustrated in FIG. 11. As illustrated in FIG. 11, both ends of the frame wire 18i are connected to the respective first gate conductive layer 14d and second gate conductive layer 14e via the respective first contact hole Ca and second contact hole Cb that are disposed in the interlayer insulating film 8. As illustrated in FIG. 11, the frame wire 18h is in contact with the upper surface of the resin substrate layer 10, in at least part of the opening A of the base coat film 11a, gate insulating film 13a and interlayer insulating film 8. The frame wire 18i is disposed in the same layer as the source electrode 18a and other components, and is made of the same material as the source electrode 18a and other components. Moreover, the capacitive conductive layer 16b is disposed in the same layer as the upper conductive layer 16a and is made of the same material as the upper conductive layer 16a.

Like the organic EL display device 50a according to the first embodiment, the organic EL display device 50d is flexible, and displays an image when the light-emitting layer 3 of the organic EL layer 23 in each sub-pixel P is caused to emit light, as appropriate, via the first TFT 9a and second TFT 9b.

The organic EL display device 50d according to the second embodiment can be manufactured by generally using the method for manufacturing the organic EL display device 50a according to the first embodiment, with the exception that the pattern shape of the metal conductive film for forming the gate electrode 14a and the pattern shape of the metal conductive film for forming the upper conductive layer 16a need to be changed.

As described above, the organic EL display device 50d according to this embodiment is configured such that the base coat film 11a, gate insulating film 13a and interlayer insulating film 8 at the bending portion B in the frame region F has the opening A penetrating the base coat film 11a, gate insulating film 13a, and interlayer insulating film 8 in the thickness direction. Herein, the base coat film 11a and the gate insulating film 13a remain in the form of multiple islands in the opening A, and constitute the base coat layers 11aa and the gate insulating layers 13aa. Moreover, each frame wire 18i on the interlayer insulating film 8 overlaps the corresponding island-shaped base coat layers 11aa and corresponding island-shaped gate insulating layers 13aa in the opening A. In addition, the capacitive conductive layer 16b is disposed in the form of islands between each frame wire 18i and the gate insulating layers 13aa overlapping each frame wire 18i. The capacitive conductive layer 16b is in contact with each frame wire 18i. Consequently, even if the frame wire 18i breaks at a site overlapping the capacitive conductive layer 16b, the capacitive conductive layer 16b overlapping this site can establish continuity in the frame wire 18i and improve the redundancy of the frame wire 18i, thereby preventing the frame wire 18i from a break at the bending portion B in the frame region F.

Third Embodiment

Figure 12:
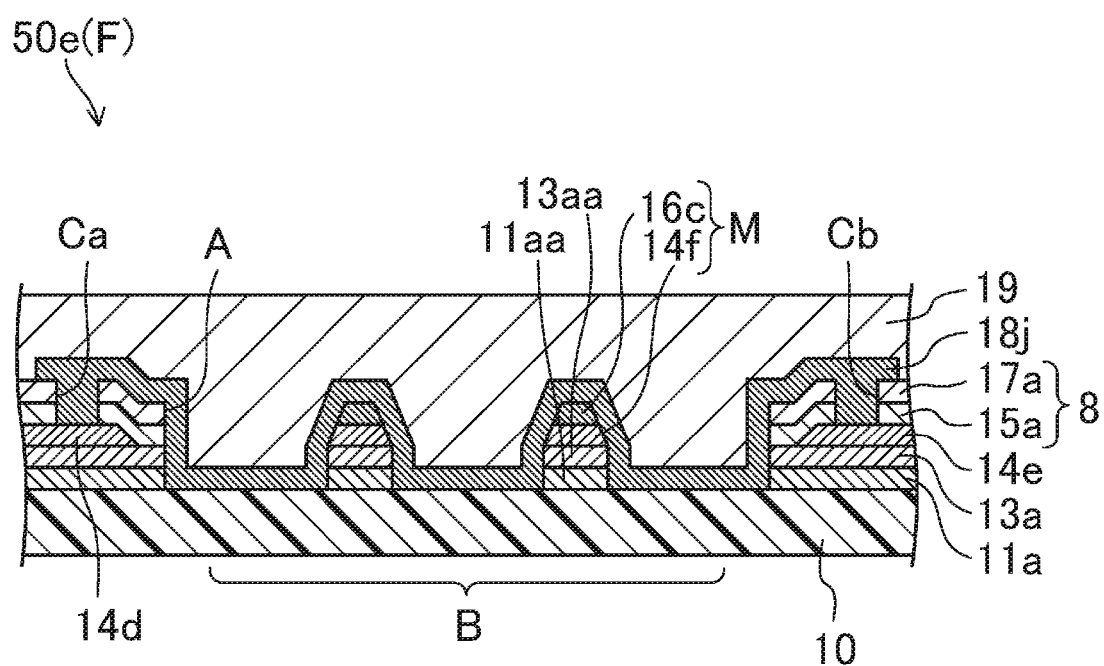
FIG. 12 is a cross-sectional view of the frame region of an organic EL display device according to a third embodiment of the disclosure.

FIG. 12 illustrates a third embodiment of the display device according to the disclosure. FIG. 12 is a cross-sectional view of the frame region F of an organic EL display device 50e according to this embodiment. FIG. 12 corresponds to FIG. 7.

The first and second embodiments have described, by way of example only, that the organic EL display devices 50a to 50d each include either gate conductive layers or capacitive conductive layers as the metal layers M that are in contact with the frame wires 18h or 18i. The third embodiment describes, by way of example only, that the organic EL display device 50e includes a stack of gate conductive layers and capacitive conductive layers as the metal layers M that are in contact with frame wires 18j.

Like the organic EL display device 50a according to the first embodiment, the organic EL display device 50e has the rectangular display region D and the frame region F having a frame shape and disposed around the display region D.

Like the organic EL display device 50a according to the first embodiment, the organic EL display device 50e includes, in the display region D, the resin substrate layer 10, the TFT layer 20 disposed on the upper surface of the resin substrate layer 10, the organic EL elements 30 disposed on the TFT layer 20, the front protective layer 41 disposed on the organic EL elements 30, and the back protective layer 42 disposed on the lower surface of the resin substrate layer 10.

The organic EL display device 50e also includes the following components in the frame region F as illustrated in FIG. 12: the resin substrate layer 10; the base coat film 11a, gate insulating film 13a, and interlayer insulating film 8 sequentially disposed on the upper surface of the resin substrate layer 10; the multiple frame wires 18j disposed on the interlayer insulating film 8 and extending in parallel with each other in a direction orthogonal to a direction where the bending portion B extends; and the flattening film 19 disposed over the frame wires 18j.

As illustrated in FIG. 12, each frame wire 18j overlaps, in the opening A, the corresponding base coat layers 11aa and corresponding gate insulating layers 13aa among the multiple base coat layers 11aa and multiple gate insulating layers 13aa. As illustrated in FIG. 12, disposed between each frame wire 18j and the gate insulating layers 13aa overlapping the frame wire 18j is the metal layer M in the form of islands that are in contact with the frame wire 18j. Each metal layer M includes the third gate conductive layer 14f and a capacitive conductive layer 16c stacked on the third gate conductive layer 14f As illustrated in FIG. 12, both ends of the frame wire 18j are connected to the respective first gate conductive layer 14d and second gate conductive layer 14e via the respective first contact hole Ca and second contact hole Cb that are disposed in the interlayer insulating film 8. As illustrated in FIG. 12, the frame wire 18j is in contact with the upper surface of the resin substrate layer 10, in at least part of the opening A of the base coat film 11a, gate insulating film 13a and interlayer insulating film 8. The frame wire 18j is disposed in the same layer as the source electrode 18a and other components, and is made of the same material as the source electrode 18a and other components. Moreover, the capacitive conductive layer 16c is disposed in the same layer as the upper conductive layer 16a and is made of the same material as the upper conductive layer 16a.

Like the organic EL display device 50a according to the first embodiment, the organic EL display device 50e is flexible, and displays an image when the light-emitting layer 3 of the organic EL layer 23 in each sub-pixel P is caused to emit light, as appropriate, via the first TFT 9a and second TFT 9b.

The organic EL display device 50e according to the third embodiment can be manufactured by generally using the method for manufacturing the organic EL display device 50a according to the first embodiment, with the exception that the pattern shape of the metal conductive film for forming the gate electrode 14a and the pattern shape of the metal conductive film for forming the upper conductive layer 16a need to be changed.

As described above, the organic EL display device 50e according to this embodiment is configured such that the base coat film 11a, gate insulating film 13a and interlayer insulating film 8 at the bending portion B in the frame region F has the opening A penetrating the base coat film 11a, gate insulating film 13a, and interlayer insulating film 8 in the thickness direction. Herein, the base coat film 11a and the gate insulating film 13a remain in the form of multiple islands in the opening A, and constitute the base coat layers 11aa and the gate insulating layers 13aa. Moreover, each frame wire 18j on the interlayer insulating film 8 overlaps the corresponding island-shaped base coat layers 11aa and corresponding island-shaped gate insulating layers 13aa in the opening A. In addition, disposed between each frame wire 18j and the gate insulating layers 13aa overlapping the frame wire 18j is the metal layer M in the form of islands that are in contact with the frame wire 18j. Each metal layer M includes the third gate conductive layer 14f and the capacitive conductive layer 16c. Consequently, even if the frame wire 18j breaks at a site overlapping the metal layer M, the metal layer M overlapping this site can establish continuity in the frame wire 18j and improve the redundancy of the frame wire 18j, thereby preventing the frame wire 18j from a break at the bending portion B in the frame region F.

Other Embodiments

The foregoing embodiments have described, by way of example only, an organic EL layer having a five-ply stack of a hole injection layer, hole transport layer, light-emitting layer, electron transport layer and electron injection layer. In some embodiments, an organic EL layer may be provided that has a three-ply stack of a hole injection-and-transport layer, light-emitting layer and electron transport-and-injection layer.

The foregoing embodiments have described, by way of example only, an organic EL display device that has a first electrode as an anode electrode and a second electrode as a cathode electrode. The disclosure is also applicable to an organic EL display device in which the organic EL layer has an inverted stack of layers: the first electrode as a cathode electrode and the second electrode as an anode electrode.

The foregoing embodiments have described, by way of example only, an organic EL display device that includes an element substrate with electrodes of TFTs connected to the first electrode, serving as drain electrodes. The disclosure is also applicable to an organic EL display device that includes an element substrate with the electrodes of the TFTs connected to the first electrode, serving as source electrodes.

The foregoing embodiments have described an organic EL display device as a display device by way of example only. The disclosure is applicable to a display device that includes multiple light-emitting elements driven by current. For instance, the disclosure is applicable to a display device that includes quantum-dot light-emitting diodes (QLEDs), which are light-emitting elements using a quantum-dot-containing layer.

INDUSTRIAL APPLICABILITY

As described above, the disclosure is useful for a flexible display device.

The invention claimed is:

1. A display device comprising:
   a resin substrate;
   a TFT layer disposed on the resin substrate;
   a light-emitting element disposed on the TFT layer and forming a display region;
   a frame region disposed around the display region;
   a terminal region disposed at an end of the frame region;
   a bending portion extending in one direction between the display region and the terminal region;
   at least one inorganic film forming the TFT layer and adjacent to the resin substrate;
   an interlayer insulating film forming the TFT layer and more remote from the resin substrate than the at least one inorganic film is, the interlayer insulating film being made of an inorganic material; and
   a plurality of wires forming the TFT layer, the plurality of wires being disposed on the interlayer insulating film in the frame region and extending in parallel with each other in a direction intersecting the one direction where the bending portion extends,
   wherein the at least one inorganic film and the interlayer insulating film comprise an opening disposed at the bending portion, the opening penetrating the at least one inorganic film and the interlayer insulating film in a thickness direction,
   the at least one inorganic film remains as a plurality of island-shaped patterns in the opening,
   each of the plurality of wires overlaps at least one corresponding island-shaped pattern among the plurality of island-shaped patterns, and
   the display device further comprises a metal layer in a form of islands disposed between each of the plurality of wires and the at least one corresponding island-shaped pattern overlapping each of the plurality of wires, the metal layer being in contact with each of the plurality of wires.

2. The display device according to claim 1, wherein the at least one inorganic film comprises a gate insulating film.

3. The display device according to claim 2, wherein
   the metal layer is disposed in the same layer as a gate electrode disposed between the gate insulating film and the interlayer insulating film, and
   the metal layer is made of the same material as the gate electrode.

4. The display device according to claim 1, wherein
   the interlayer insulating film comprises a first interlayer insulating film and a second interlayer insulating film sequentially disposed in such a manner that the first interlayer insulating film is closer to the resin substrate than the second interlayer insulating film is,
   the metal layer is disposed in the same layer as a capacitance line disposed between the first and second interlayer insulating films, and
   the metal layer is made of the same material as the capacitance line.

5. The display device according to claim 2, wherein
   the interlayer insulating film comprises a first interlayer insulating film and a second interlayer insulating film sequentially disposed in such a manner that the first interlayer insulating film is closer to the resin substrate than the second interlayer insulating film is,
   the metal layer comprises
      a first metal layer disposed in the same layer as a gate electrode disposed between the gate insulating film and the interlayer insulating film, the first metal layer being made of the same material as the gate electrode, and
      a second metal layer stacked on the first metal layer, the second metal layer being disposed in the same layer as a capacitance line disposed between the first and second interlayer insulating films, the second metal layer being made of the same material as the capacitance line.

6. The display device according to claim 1, wherein in at least a part of the opening, each of the plurality of wires is in contact with an upper surface of the resin substrate.

7. The display device according to claim 2, further comprising
   a base coat film disposed between the resin substrate and the gate insulating film, the base coat film being made of an inorganic material,
   wherein in at least a part of the opening, each of the plurality of wires is in contact with an upper surface of the base coat film.

8. The display device according to claim 2, further comprising
   a base coat film disposed between the resin substrate and the gate insulating film, the base coat film being made of an inorganic material,
   wherein the base coat film comprises an opening overlapping the opening of the gate insulating film and the interlayer insulating film, and
   each of the plurality of wires is in contact with an upper surface of the resin substrate, in at least a part of the openings of the gate insulating film and the interlayer insulating film and of the base coat film.

9. The display device according to claim 1, wherein
   in a pair of the plurality of wires adjacent to each other, the metal layer along one of the pair of the plurality of wires and the metal layer along the other of the pair of the plurality of wires overlap each other in a direction where the plurality of wires extend, and do not overlap each other in a direction intersecting the direction where the plurality of wires extend.

10. The display device according to claim 1, wherein each of the plurality of island-shaped patterns comprises a perimeter surface coinciding with a perimeter surface of the corresponding metal layer.

11. The display device according to claim 1, further comprising a flattening film disposed at the bending portion and covering the plurality of wires.

12. The display device according to claim 11, wherein the resin substrate and the flattening film are made of a polyimide resin.

13. The display device according to claim 1, wherein the opening of the at least one inorganic film and the interlayer insulating film comprises a groove penetrating in the one direction where the bending portion extends.

14. The display device according to claim 1, wherein the light-emitting element comprises an organic EL element.

* * * * *